US008969177B2

(12) United States Patent
Chowdhury et al.

(10) Patent No.: US 8,969,177 B2
(45) Date of Patent: *Mar. 3, 2015

(54) LASER AND PLASMA ETCH WAFER DICING WITH A DOUBLE SIDED UV-CURABLE ADHESIVE FILM

(71) Applicant: Applied Materials, Inc., Santa Clara, CA (US)

(72) Inventors: Mohammad Kamruzzaman Chowdhury, Santa Clara, CA (US); Wei-Sheng Lei, San Jose, CA (US); Todd Egan, Fremont, CA (US); Brad Eaton, Menlo Park, CA (US); Madhava Rao Yalamanchili, Morgan Hill, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/917,568

(22) Filed: Jun. 13, 2013

(65) Prior Publication Data
US 2014/0004685 A1    Jan. 2, 2014

Related U.S. Application Data

(60) Provisional application No. 61/666,566, filed on Jun. 29, 2012.

(51) Int. Cl.
*H01L 21/00* (2006.01)
*H01L 21/78* (2006.01)
(Continued)

(52) U.S. Cl.
CPC ............ *H01L 21/78* (2013.01); *B23K 26/367* (2013.01); *H01L 21/67207* (2013.01);
(Continued)

(58) Field of Classification Search
USPC .......................... 438/113, 114, 460, 462–465
See application file for complete search history.

(56) References Cited

U.S. PATENT DOCUMENTS

| 4,049,944 A | 9/1977 | Garvin et al. |
| 5,593,606 A | 1/1997 | Owen et al. |

(Continued)

FOREIGN PATENT DOCUMENTS

| JP | 9216085 | 8/1997 |
| JP | 10321908 | 12/1998 |

(Continued)

OTHER PUBLICATIONS

Linder, V. et al., "Water-Soluble Sacrificial Layers for Surface Micromachining", www.small-journal.com, 2005, 1, No. 7, 7 pgs.
(Continued)

*Primary Examiner* — Mary Wilczewski
*Assistant Examiner* — Erik T Peterson
(74) *Attorney, Agent, or Firm* — Blakely Sokoloff Taylor Zafman LLP

(57) ABSTRACT

Laser and plasma etch wafer dicing using UV-curable adhesive films. A mask is formed covering ICs formed on the wafer, as well as any bumps providing an interface to the ICs. The semiconductor wafer is coupled to a carrier substrate by a double-sided UV-curable adhesive film. The mask is patterned by laser scribing to provide a patterned mask with gaps. The patterning exposes regions of the semiconductor wafer, below thin film layers from which the ICs are formed. The semiconductor wafer is then etched through the gaps in the patterned mask to singulate the ICs. The UV-curable adhesive film is partially cured by UV irradiation through the carrier. The singulated ICs are then detached from the partially cured adhesive film still attached to the carrier substrate, for example individually by a pick and place machine. The UV-curable adhesive film may then be further cured for the film's complete removal from the carrier substrate.

22 Claims, 9 Drawing Sheets

(51) Int. Cl.
*B23K 26/36* (2014.01)
*H01L 21/67* (2006.01)
*B23K 26/06* (2014.01)
*B23K 26/18* (2006.01)
*B23K 26/40* (2014.01)

(52) U.S. Cl.
CPC ........ *B23K 26/0635* (2013.01); *B23K 26/0661* (2013.01); *B23K 26/18* (2013.01); *B23K 26/365* (2013.01); *B23K 26/4075* (2013.01); *B23K 26/409* (2013.01); *H01L 21/67115* (2013.01); *B23K 2201/40* (2013.01)
USPC ............ 438/464; 438/462; 438/463; 438/113

(56) References Cited

U.S. PATENT DOCUMENTS

| | | | |
|---|---|---|---|
| 5,670,260 A * | 9/1997 | Zajaczkowski et al. | 428/345 |
| 6,039,830 A * | 3/2000 | Park et al. | 156/267 |
| 6,057,180 A | 5/2000 | Sun et al. | |
| 6,174,271 B1 | 1/2001 | Kosmowski | |
| 6,306,731 B1 | 10/2001 | Igarashi et al. | |
| 6,391,679 B1 * | 5/2002 | Anker et al. | 438/106 |
| 6,407,363 B2 | 6/2002 | Dunsky et al. | |
| 6,425,971 B1 * | 7/2002 | Silverbrook | 156/230 |
| 6,465,158 B1 | 10/2002 | Sekiya | |
| 6,528,864 B1 | 3/2003 | Arai | |
| 6,574,250 B2 | 6/2003 | Sun et al. | |
| 6,582,983 B1 | 6/2003 | Runyon et al. | |
| 6,593,542 B2 | 7/2003 | Baird et al. | |
| 6,638,865 B2 * | 10/2003 | Tanaka | 438/692 |
| 6,642,127 B2 | 11/2003 | Kumar et al. | |
| 6,676,878 B2 | 1/2004 | O'Brien et al. | |
| 6,696,669 B2 | 2/2004 | Hembree et al. | |
| 6,706,998 B2 | 3/2004 | Cutler | |
| 6,756,288 B1 * | 6/2004 | Feil et al. | 438/464 |
| 6,759,275 B1 | 7/2004 | Lee et al. | |
| 6,803,247 B2 | 10/2004 | Sekiya | |
| 6,887,650 B2 * | 5/2005 | Shimoda et al. | 430/311 |
| 6,887,804 B2 | 5/2005 | Sun et al. | |
| 6,969,669 B2 | 11/2005 | Arita | |
| 6,998,571 B2 | 2/2006 | Sekiya et al. | |
| 7,112,467 B2 * | 9/2006 | Eichelberger et al. | 438/106 |
| 7,128,806 B2 | 10/2006 | Nguyen et al. | |
| 7,129,150 B2 | 10/2006 | Kawai | |
| 7,179,723 B2 | 2/2007 | Genda et al. | |
| 7,265,033 B2 | 9/2007 | Shigematsu et al. | |
| 7,364,986 B2 | 4/2008 | Nagai et al. | |
| 7,435,607 B2 | 10/2008 | Nagai | |
| 7,459,377 B2 | 12/2008 | Ueda et al. | |
| 7,468,309 B2 | 12/2008 | Shigematsu et al. | |
| 7,473,866 B2 | 1/2009 | Morishige et al. | |
| 7,507,639 B2 | 3/2009 | Nakamura | |
| 7,629,228 B2 | 12/2009 | Haji et al. | |
| 7,678,670 B2 | 3/2010 | Arita et al. | |
| 7,687,740 B2 | 3/2010 | Bruland et al. | |
| 7,754,584 B2 | 7/2010 | Kumakawa | |
| 7,767,551 B2 | 8/2010 | Arita et al. | |
| 7,767,554 B2 | 8/2010 | Arita et al. | |
| 7,776,720 B2 | 8/2010 | Boyle et al. | |
| 7,838,323 B2 | 11/2010 | Utsumi et al. | |
| 7,859,084 B2 | 12/2010 | Utsumi et al. | |
| 7,875,898 B2 | 1/2011 | Maeda | |
| 7,906,410 B2 | 3/2011 | Arita et al. | |
| 7,923,351 B2 | 4/2011 | Arita | |
| 7,927,973 B2 | 4/2011 | Haji et al. | |
| 2002/0096743 A1 * | 7/2002 | Spooner et al. | 257/620 |
| 2003/0096075 A1 * | 5/2003 | Dollase et al. | 428/40.1 |
| 2003/0162313 A1 | 8/2003 | Kim et al. | |
| 2004/0080045 A1 | 4/2004 | Kimura et al. | |
| 2004/0137700 A1 | 7/2004 | Sekiya | |
| 2005/0215030 A1 * | 9/2005 | Yamamoto | 438/458 |
| 2006/0024924 A1 | 2/2006 | Haji et al. | 438/464 |
| 2006/0038206 A1 * | 2/2006 | Shimoyama et al. | 257/273 |
| 2006/0043535 A1 | 3/2006 | Hiatt | |
| 2006/0051935 A1 * | 3/2006 | Silverbrook | 438/458 |
| 2006/0205182 A1 | 9/2006 | Soejima | |
| 2009/0004780 A1 * | 1/2009 | Arita et al. | 438/114 |
| 2009/0255911 A1 | 10/2009 | Krishnaswami et al. | |
| 2010/0003771 A1 * | 1/2010 | Nagai et al. | 438/15 |
| 2010/0015782 A1 | 1/2010 | Yu et al. | 438/463 |
| 2010/0022071 A1 | 1/2010 | Arita et al. | 438/463 |
| 2010/0055875 A1 * | 3/2010 | Haji et al. | 438/463 |
| 2010/0173474 A1 * | 7/2010 | Arita et al. | 438/462 |
| 2010/0246152 A1 | 9/2010 | Lin et al. | |
| 2010/0279491 A1 * | 11/2010 | Kiuchi et al. | 438/464 |
| 2011/0018127 A1 * | 1/2011 | Lee | 257/729 |
| 2011/0312157 A1 * | 12/2011 | Lei et al. | 438/462 |
| 2012/0322236 A1 * | 12/2012 | Lei et al. | 438/462 |
| 2012/0322238 A1 * | 12/2012 | Lei et al. | 438/462 |
| 2012/0322239 A1 * | 12/2012 | Singh et al. | 438/462 |
| 2012/0322240 A1 * | 12/2012 | Holden et al. | 438/462 |
| 2012/0322241 A1 * | 12/2012 | Holden et al. | 438/462 |
| 2012/0322242 A1 * | 12/2012 | Lei et al. | 438/462 |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| KR | 100878408 | 1/2009 |
| WO | WO-03036712 | 5/2003 |
| WO | WO-03071591 | 5/2003 |

OTHER PUBLICATIONS

Singh, Saravjeet et al., "Apparatus and Methods for Dry Etch With Edge, Side and Back Protection", U.S. Appl. No. 61/491,693, filed May 31, 2011 24 pgs.

International Search Report and Written Opinion for PCT Patent Application No. PCT/US2013/036657 mailed Jul. 1, 2013, 11 pgs.

Office Action mailed Jun. 4, 2014, in U.S. Appl. No. 13/847,964, 9 pages.

* cited by examiner

LASER AND PLASMA ETCH WAFER DICING WITH A DOUBLE SIDED UV-CURABLE ADHESIVE FILM

PRIORITY

This application is a Non-Provisional of, claims priority to, and incorporates by reference in its entirety for all purposes, the U.S. Provisional Patent Application No. 61/666,566 filed Jun. 29, 2012.

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice or dies.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dies. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dies. In addition, cracks can form and propagate from the edges of the dies into the substrate and render the integrated circuit inoperative. Chipping and cracking are particularly a problem with scribing because only one side of a square or rectangular die can be scribed in the direction of the crystalline structure. Consequently, cleaving of the other side of the die results in a jagged separation line. Because of chipping and cracking, additional spacing is often required between the dies on the wafer to prevent damage to the integrated circuits. Such additional spacing can keep the chips and cracks at a distance from the actual integrated circuits. As a result of the spacing requirements, not as many dies can be formed on a standard sized wafer and wafer real estate that could otherwise be used for circuitry is wasted. The use of a saw exacerbates the waste of real estate on a semiconductor wafer. The blade of a typical saw is approximately 15 microns thick. As such, to insure that cracking and other damage surrounding the cut made by the saw does not harm the integrated circuits, three to five hundred microns often must separate the circuitry of each of the dies. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

Embodiments of the present invention are directed to laser and plasma etch wafer dicing using UV-curable adhesive films. In an embodiment, a method of dicing a wafer including a plurality of integrated circuits includes forming a mask above the semiconductor wafer. The mask covers and protects the integrated circuits. The mask can also cover and protect any bump protruding from the integrated circuits. The method includes coupling (or affixing) the masked wafer to a carrier substrate with a double-sided ultra-violet (UV)-curable adhesive film. The method further includes patterning the mask with a laser scribing process to provide a patterned mask with gaps. The gaps expose regions of the semiconductor wafer between the integrated circuits. The method includes etching the laser-scribed semiconductor wafer through the gaps in the patterned mask to form singulated integrated circuits. The method further includes irradiating the UV-curable adhesive film with UV light sufficient to cure a first side of the UV-curable adhesive film and permit detaching the singulated integrated circuits from the UV-curable adhesive film.

In an embodiment, a method of dicing a semiconductor wafer including a plurality of integrated circuits includes coupling a masked crystalline silicon substrate to a carrier substrate with a double-sided UV-curable adhesive film. A laser scribing process patterns the mask, and at least a layer of silicon dioxide, a layer of low K material, and a layer of copper is patterned to expose regions of the silicon substrate between the integrated circuits. The method includes etching the silicon substrate through the exposed regions to form singulated integrated circuits. The method further includes irradiating the UV-curable adhesive film with ultra-violet (UV) light to cure a first adhesive side before curing a second adhesive side. The method includes detaching the singulated integrated circuits from the cured side of the UV-curable adhesive film.

In an embodiment, a system for dicing a semiconductor wafer having a plurality of integrated circuits includes a laser scribe apparatus to pattern a mask disposed on the semiconductor wafer. The laser scribe apparatus is to further pattern at least a layer of silicon dioxide, a layer of low K material, and a layer of copper to expose regions of the silicon substrate between the integrated circuits. The system further includes a plasma etch chamber to etch the silicon substrate through the exposed regions to form singulated integrated circuits. An ultra-violet (UV) light source is to irradiate the UV-curable adhesive film and to cure a first adhesive side of the UV-curable adhesive film more completely than a second adhesive side. A die harvester is to detach the singulated integrated circuits from the partially-cured UV-curable adhesive film. The system further includes a factory interface. The laser scribe apparatus can be coupled with the factory interface.

The plasma etch chamber can also be coupled with the factory interface. The laser scribe apparatus and the plasma etch chamber are adapted to clamp the substrate carrier, for example by electrostatic chucking.

BRIEF DESCRIPTION OF THE DRAWINGS

Embodiments of the present invention are illustrated by way of example, and not by way of limitation, and can be more fully understood with reference to the following detailed description when considered in connection with the figures in which.

DETAILED DESCRIPTION

Figure 1A:
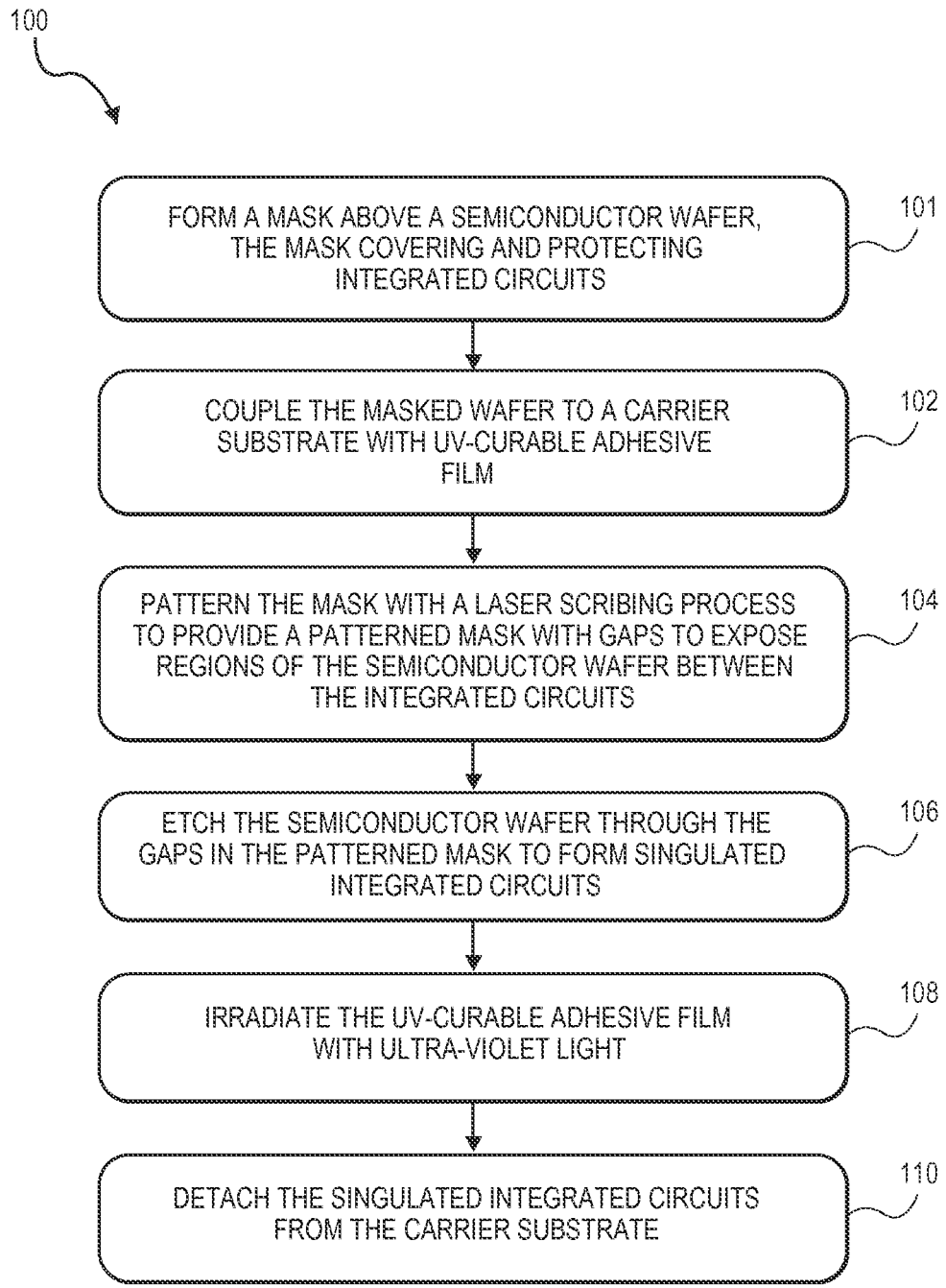
FIG. 1A is a flowchart representing operations in a method of dicing a semiconductor wafer including a plurality of integrated circuits, in accordance with an embodiment of the present invention.

Methods of dicing semiconductor wafers, each wafer having a plurality of integrated circuits thereon, are described. In the following description, numerous specific details are set forth, such as laser and plasma etch wafer dicing approaches with UV-curable adhesive films, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

A hybrid wafer or substrate dicing process involving an initial laser scribe and subsequent plasma etch may be implemented for die singulation. The laser scribe process may be used to cleanly remove a mask layer, organic and inorganic dielectric layers, and device layers. The laser etch process may then be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing.

In a hybrid wafer or substrate dicing process, a wafer is specifically handled for both dicing and separated die harvest. The wafer to be diced is generally mounted on a carrier substrate with a UV-curable adhesive film (e.g., UV-release dicing tape). The carrier substrate is both transmissive of UV radiation, to permit subsequent controlled curing of the UV-curable adhesive film, and also amenable to robotic handling and clamping inside a plasma etch chamber for control of the wafer temperature. The carrier should also ensure the cleanliness of separated dies for subsequent die pick. In contrast to mounting a wafer on dicing tape and a tape frame, which would likely entail interfacing specialized robotic handling to a plasma etch chamber, embodiments of the present invention include the use of a rigid UV transparent wafer, such as, but not limited to, glass, having similar mechanical and electrical properties as a semiconductor wafer.

In an embodiment, a semiconductor wafer is mounted on a first adhesive side of a double-side UV-curable adhesive film with a second adhesive side mounted onto the carrier substrate. As such, a tape frame is not involved in the plasma etching phase and may further be similarly avoided in the laser scribing process performed prior to plasma etching. Following the plasma etching, the first adhesive layer of the UV-curable adhesive film to which the dies are mounted is cured with exposure to UV radiation. Subsequently, individual dies may be picked from the UV-curable adhesive film, or alternatively a second dicing tape with a frame may be applied to a front side of the semiconductor wafer and dies removed from the UV-curable adhesive film en masse and individual dies then picked from the taped frame for subsequent operations (e.g., packaging and assembly operations).

In an embodiment, a suitable wafer thickness for the above approach is approximately 120 microns or thicker. For IC memory chips, as memory capacity increases, multichip functions and continuous packaging miniaturization may require ultra-thin wafer dicing. For logic device chips/processors, major challenges lie in IC performance increase, low k materials and other material adoption. Wafer thicknesses in the range of approximately 100 microns to 760 microns can be used for such applications to ensure sufficient chip integrity. Processor chip designers/fabricators may place test element groups (TEGs or test patterns) as well as alignment patterns in wafer streets. A kerf width approximately in the range of 50 microns to 100 microns, at least at the top surface of the wafer, may thus be needed to separate adjacent chips and remove only the test patterns. A major focus is to achieve delamination-free and efficient dicing processes.

For a diamond saw cutting based pure mechanical approach, when used for low-k wafer dicing, even with drastic speed reductions (e.g., down to 2 to 3 mm/sec from typically 40-100 mm/sec), chipping and delamination/crack formation due to mechanical stresses are typically unavoidable in most low-k wafer dicing. Pure laser ablation based dicing technology faces great challenges in throughput improvement, maintaining required die strength and side wall roughness, as well as reducing chances of delamination and chipouts when high power is used to address required throughput.

Several hybrid technologies combine laser and the conventional dicing saw to address low-k wafer dicing. First, a laser scribes through the top passivation and metal structures within the street, which the mechanical dicing saw has difficulties cutting through. Next, the saw is used to cut through the actual silicon (Si) substrate. Such a hybrid process may be very slow and typical mechanical sawing problems remain. For example, the wafer backside chipping inherent to the mechanical stress from diamond saw dicing still remains.

Furthermore, mitigation of laser induced front side chipping and delamination associated with low k dielectric stacks has been attempted. For example, in one approach a sealing ring surrounds each die as a barrier to propagation of interlayer dielectric and metal layers peeling/delamination. Also, copper grids of certain copper density (e.g., typically 20-80%) in the form of squares called dummy fill or tiling is added under the passivation layer in the streets wherever there is an absence of alignment or test patterns. Such approaches have aided in suppressing the delamination and chipping. For wafers of 100 microns or thicker, when being diced, the rigidity may be sufficient to directly place the wafers on mounting tapes without die attach film (DAF) such that no DAF cutting process is involved.

Embodiments described herein may address dicing applications of IC wafers, especially with processor chips that have a thickness approximately in the range of 100 microns to 800 microns, and more particularly approximately in the range of 100 microns to 600 microns thickness. Furthermore, embodiments may address dicing applications of IC wafers with an acceptable dicing kerf width approximately in the range of 50 microns to 200 microns, and more particularly approximately in the range of 50 microns to 100 microns measured on the wafer front surface. A range of 50-100 microns measured on the wafer front surface corresponds to a typical kerf width measured from the back side of the wafer of approximately 30-50 microns in a laser/saw hybrid process. One or more embodiments are directed to a hybrid laser scribing plus plasma etching approach to dice wafers as described above.

Figure 1B:
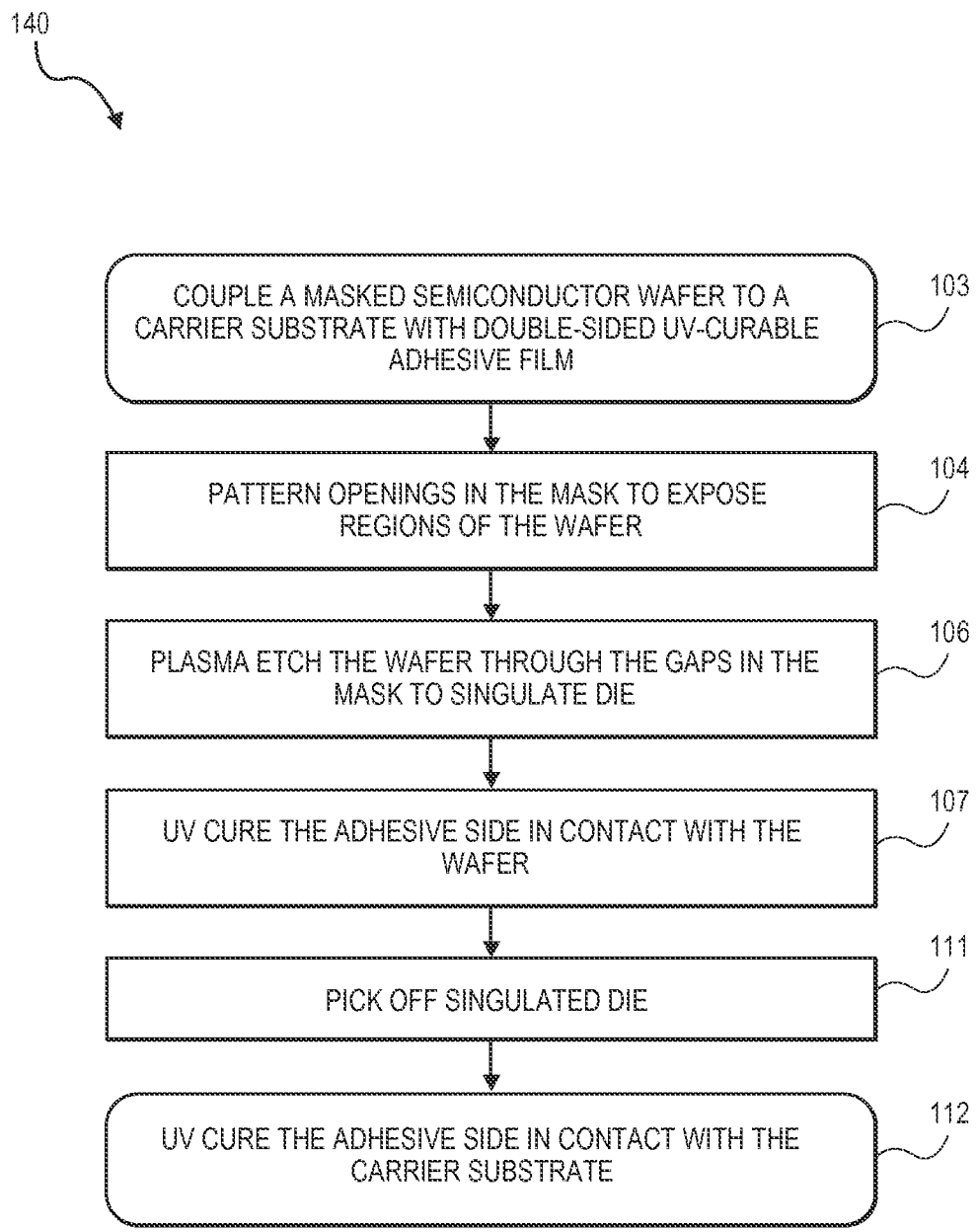
FIG. 1B is a flowchart representing operations in a method of dicing a semiconductor wafer including a plurality of integrated circuits, in accordance with an embodiment of the present invention.
Figure 2A:
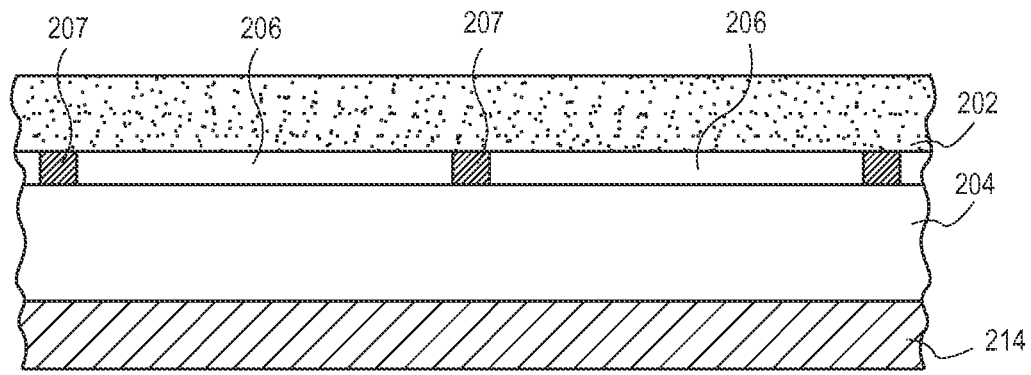
FIG. 2A illustrates a cross-sectional view of a semiconductor wafer including a plurality of integrated circuits during performance of a method of dicing the semiconductor wafer, corresponding to operation 101 of FIG. 1A, in accordance with embodiments of the present invention.
Figure 2B:
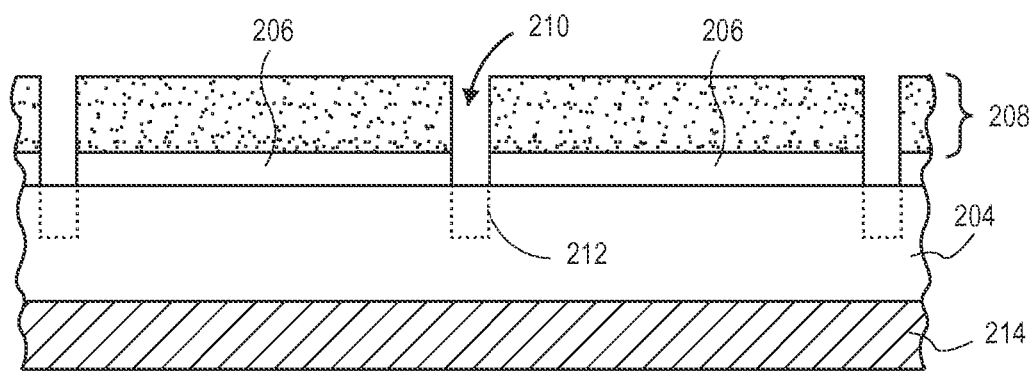
FIG. 2B illustrates a cross-sectional view of a semiconductor wafer including a plurality of integrated circuits during performance of a method of dicing the semiconductor wafer, corresponding to operation 104 of FIG. 1A and FIG. 1B, in accordance with embodiments of the present invention.
Figure 2C:
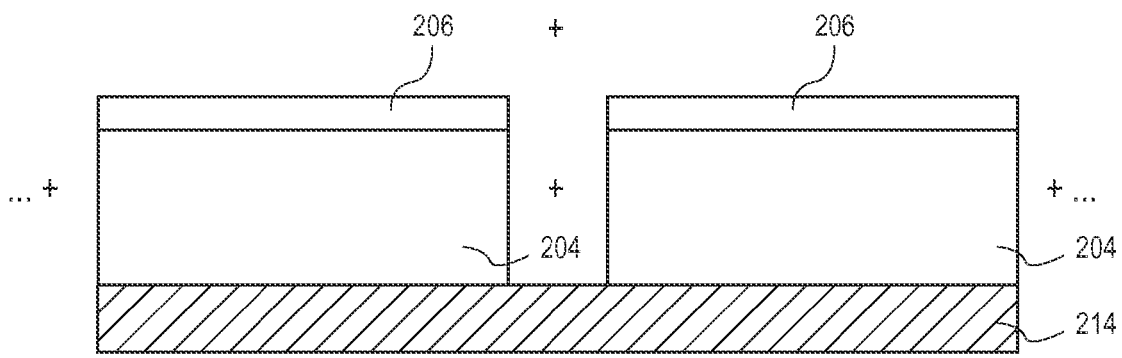
FIG. 2C illustrates a cross-sectional view of a semiconductor wafer including a plurality of integrated circuits during performance of a method of dicing the semiconductor wafer, corresponding to operation 106 of FIGS. 1A and 1B, in accordance with embodiments of the present invention.

FIG. 1A illustrates operations in a method 100 of dicing a semiconductor wafer including a plurality of integrated circuits, in accordance with an embodiment of the present invention. FIG. 1B illustrates operations in a method 140 of dicing a semiconductor wafer including a plurality of integrated circuits, in accordance with an embodiment of the present invention. Method 140 of FIG. 1B is one exemplary embodiment of the more general method 100 of FIG. 1A. FIGS. 2A-2C illustrate cross-sectional views of a semiconductor wafer including a plurality of integrated circuits during performance of the methods 100 and 140 while FIGS. 4A-4I illustrate cross-sectional views of attachment and detachment of the semiconductor wafer to a carrier substrate during performance of the methods 100 and 140.

Figure 4A:
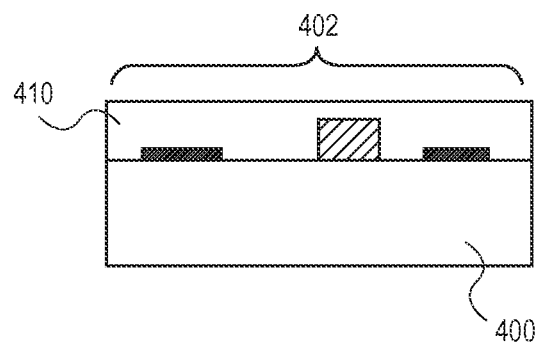
FIGS. 4A, 4B, 4C, 4D, 4E, 4F, 4G, 4H, and 4I illustrate cross-sectional views of various operations in a method of dicing a semiconductor wafer corresponding to operations 101, 102, 104, 106, 107, 108, 110, and 112, in accordance with embodiments of the present invention.

Referring to operation 101 of Flowchart 100, and corresponding FIG. 2A, a method includes forming a mask 202 above a semiconductor wafer or substrate 204. The wafer or substrate 204 is disposed on a double-sided UV-curable adhesive film 214. The double-sided UV-curable adhesive film 214 may be further disposed on a substrate (not shown in FIGS. 2A-2C), as described in greater detail in association with FIGS. 4A-4I. As is shown in FIG. 4A, a mask 410, which may be any of the materials described for mask 202 is disposed on an active side 402 of semiconductor wafer 400. Forming the mask 410 of FIGS. 4A and 202 of FIG. 2A over a semiconductor wafer can involve spin coating a resist or other material, carbon vapor deposition (CVD), or any other process known in the art capable of forming a mask layer. Although illustrated in FIG. 4A as a non-conformal, planarized mask (e.g., thickness of the mask 410 over a bump is less than thickness of the mask 410 in a valley), in an alternate embodiment, the mask 410 is a conformal mask. Conformal mask embodiments advantageously ensure sufficient thickness of the mask 410 over topography (e.g., 20 μm bumps) to survive the duration of plasma etch dicing operation. Formation of a conformal mask may be by, as mentioned above, spin coating or CVD. Forming a non-conformal mask can include the additional step of planarizing (i.e., polishing) a conformal mask.

Depending on the thickness of the material properties of the semiconductor wafer 400, the mask 410 may be applied before or after attaching the wafer 400 to a carrier substrate. In the exemplary embodiment illustrated in FIG. 1A and FIG. 4A, the mask is applied prior to attaching the semiconductor wafer 400 to a carrier substrate. In certain such embodiments, the wafer 400 has a thickness greater than 350 μm. In one embodiment, the mask is applied subsequent to attaching the semiconductor wafer 400 to a carrier substrate. In certain such embodiments, the wafer 400 has a thickness less than 350 μm.

As shown in FIG. 2B, the mask 202 covers and protects integrated circuits (ICs) 206 formed on the surface of the semiconductor wafer 204 and also protects bumps projecting or protruding up 10-20 μm from the surface of the semiconductor wafer 204. The mask 202 also covers intervening streets 207 formed between adjacent ones of the integrated circuits 206.

In accordance with an embodiment of the present invention, forming the masks 202 and 410 includes forming a layer such as, but not limited to, a photo-resist layer or an I-line patterning layer. For example, a polymer layer such as a photo-resist layer may be composed of a material otherwise suitable for use in a lithographic process. In one embodiment, the photo-resist layer is composed of a positive photo-resist material such as, but not limited to, a 248 nanometer (nm) resist, a 193 nm resist, a 157 nm resist, an extreme ultra-violet (EUV) resist, or a phenolic resin matrix with a diazonaphthoquinone sensitizer. In another embodiment, the photo-resist layer is composed of a negative photo-resist material such as, but not limited to, poly-cis-isoprene and poly-vinyl-cinnamate.

In an embodiment, semiconductor wafers or substrates 204 of FIGS. 2A-2C and 400 of FIG. 4A-4I are of a material suitable to withstand a fabrication process and upon which semiconductor processing layers may suitably be disposed. For example, in one embodiment, semiconductor wafer or substrate 204 is composed of a group IV-based material such as, but not limited to, crystalline silicon, germanium or silicon/germanium. In a specific embodiment, providing semiconductor wafer 204 includes providing a monocrystalline silicon substrate. In a particular embodiment, the monocrystalline silicon substrate is doped with impurity atoms. In another embodiment, semiconductor wafer or substrate 204 is composed of a III-V material such as, e.g., GaN used in the fabrication of light emitting diodes (LEDs).

Referring to FIG. 2A, the semiconductor wafer or substrate 204 has disposed thereon or therein, as a portion of the integrated circuits 206, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits 206. Conductive bumps and passivation layers may be formed above the interconnect layers. Materials making up the streets 207 may be similar to or the same as those materials used to form the integrated circuits 206. For example, the streets 207 may be composed of layers of dielectric materials, semiconductor materials, and/or metallization. In one embodiment, one or more of the streets 207 includes test devices similar to the actual devices of the integrated circuits 206.

Returning to FIG. 1A, the method 100 proceeds with coupling a semiconductor wafer to a carrier substrate with a double-sided UV-curable adhesive film at operation 102. In an embodiment, the UV-curable adhesive film 214 in FIGS. 2A-2C and the UV-curable adhesive film 406 in FIGS. 4A-I is a double-sided dicing tape including a carrier film disposed between first and second adhesive layers. In one such embodiment, the carrier film is composed of polyvinyl chloride and the two adhesive layers are acrylic-based adhesive layers. In an embodiment, each of the first and second adhesive layers is a composed of a material, or materials, with an adhesive property that weakens (i.e., releases) upon exposure to UV light. In the exemplary embodiment, the first adhesive layer has a shorter curing time than the second adhesive layer. Such differentiation in cure time or cure rate may be achieved either by differentiating the thickness of the adhesive between the first and second sides (e.g., with the first side being of a lesser thickness than the second side) or by changing the viscosity and solid content, differentiating the chemistry of the adhesive between the first and second sides (e.g., with the first side being more sensitive to UV radiation).

Figure 4B:
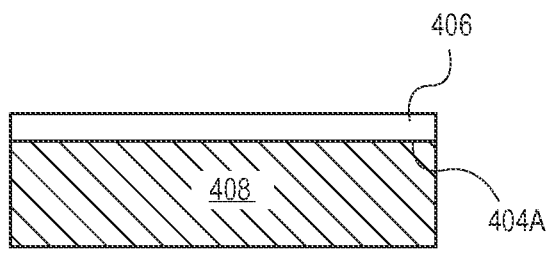
Figure 4C:
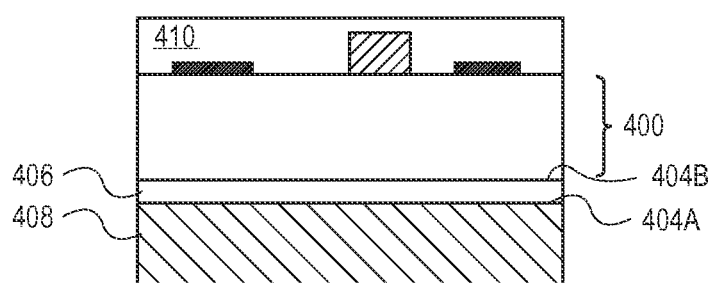

In one embodiment, as shown in FIG. 2B, coupling the wafer to the carrier substrate is performed by contacting one adhesive layer 404A to the carrier substrate 408. In embodiments where the cure time between adhesives on a double-sided film is different, the adhesive with the longest cure time, or slowest cure rate (e.g., thickest adhesive layer) is contacted onto the carrier substrate 408. In the embodiment illustrated, the double-sided UV-cure adhesive film is applied, for example with a conventional wafer tape applicator, first to the carrier substrate 408 (as is illustrated in FIG. 4B), before contacting the second adhesive side to the semiconductor wafer 400 (as is illustrated in FIG. 4C). Because the carrier substrate 408 is approximately the same diameter as the wafer 400 (e.g., 300 mm) to enable conventionally dimensioned robotic handling in a plasma etch apparatus, the wafer 400 may be aligned to the taped carrier substrate 408 before contacting the exposed adhesive. In an alternative embodiment, the double-sided UV-cure adhesive film is applied, for example with a conventional wafer tape applicator, first to the semiconductor wafer 400, before contacting the second adhesive side to the carrier substrate 408. For such embodiments, the first side of the double-side UV-curable tape is applied to the wafer backside (opposite the front side 402). The taped wafer is then aligned with an untaped carrier substrate and brought into contact with the carrier substrate.

In embodiments, the carrier substrate 408 is UV transmissive, meaning at least some amount of UV energy can pass through the carrier substrate 408. In embodiments, the carrier 408 is a material having a band gap greater than that required to absorb UV energy, such as, but not limited to glass (e.g., soda-lime glass, float glass, or other silica glasses, such as borosilicate glass (Corning 7740), fused quartz, sapphire, and ceramics such as AlN and SiC. Of these materials, those that offer both a coefficient of thermal expansion (CTE) that is well matched with that of silicon and a relatively broad UV transparency window facilitate mechanical coupling of a thinned semiconductor substrate to the carrier substrate with UV-sensitive adhesives to form a multi-layered workpiece illustrated in FIG. 4C, and referred to as a silicon-on-glass (SiOG) substrate in the exemplary glass carrier embodiment.

Depending on extinction coefficients for given wavelengths of light, the carrier 408 may have a thickness that is sufficiently thin to transmit UV. As such, the thickness of the carrier may vary widely from 300 μm to 800 μm, or more. Generally, the carrier substrate diameter is to be within 10 mm of the semiconductor wafer diameter so as to permit robotic handling of the SiOG substrate, for example during the plasma etch phase of the dicing process. Therefore, according to embodiments of the invention, the carrier substrate will be at least 300 mm (+/−10 mm) for a 300 mm semiconductor wafer, and 450 mm (+/−10 mm) for a 450 mm semiconductor wafer, etc. Thickness may scale with diameter, with one example of a Corning 7740 carrier substrate having a diameter of 300 mm and a thickness of 700 μm.

In further embodiments, the carrier substrate 408 is doped (e.g., with sodium) to have a resistivity no greater than $10^8$ Ohm-cm at 20° C. and preferably less than 500 Megaohm/square at 20° C. Such a conductivity range has been found sufficient to permit electrostatic chucking of the carrier substrate 408 in a plasma etch system employing a Johnsen-Rahbeck style chuck, particularly where the carrier substrate is first heated to 50° C., or more. Of course, where mechanical clamping is employed, carrier substrate resistivity is of no practical importance.

As shown in FIG. 4C, with the double-sided adhesive film 406 applied to a side of the carrier substrate 408 by way of the adhesive 404A, the semiconductor wafer 400 is affixed to the other adhesive layer 404B with the mask 410 exposed. Although it is advantageous to apply the adhesive to the carrier substrate first where the semiconductor wafer 400 is very fragile, in alternate embodiments the double-sided adhesive film 406 (e.g., the adhesive layer 404B) may also be applied to the wafer 400 first and then the other side of the adhesive film (e.g., the adhesive layer 404A) applied to the carrier substrate 408.

Figure 4D:
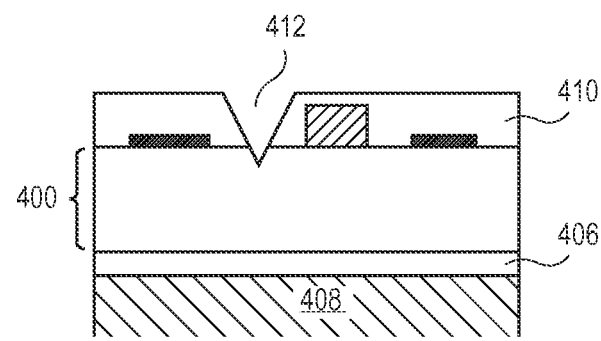
Figure 4E:
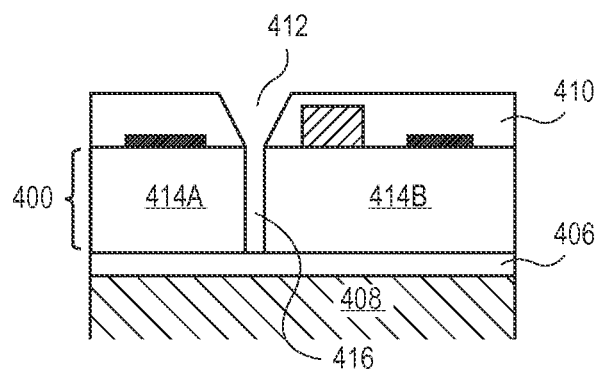
Figure 4F:
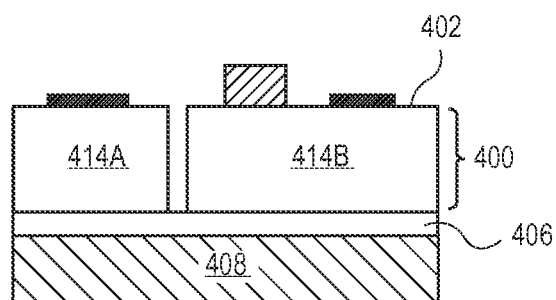

Returning to FIG. 1A, with the semiconductor wafer mounted onto the carrier, the method 100 of FIG. 1A proceeds to the operation 102 with the masked semiconductor wafer coupled to a carrier substrate with double-sided UV-curable adhesive film. Similarly, the method 140 of FIG. 1B begins with operation 103, for example taking as an input starting material the assembly thus far prepared by method 100. Both the methods 100 and 140 then proceed with a laser scribe operation 104 and a plasma etch operation 106. FIG. 2B provides a proximal cross-sectional view of the mask 202 being patterned with a laser scribing process to provide a patterned mask 208 with gaps 210. The patterned mask 208 with gaps 210 exposes regions of the semiconductor wafer or substrate 204 between the integrated circuits 206. FIG. 4D provides a distal cross-section view of the laser scribe process forming the gaps 412 while the substrate 400 is affixed to the carrier substrate 408 by adhesive film 406.

Referring to FIG. 2B, the laser scribing process is generally to remove the material of the streets 207 present between the integrated circuits 206. In accordance with an embodiment of the present invention, patterning the mask 202 with the laser scribing process includes forming trenches 212 partially into the regions of the semiconductor wafer 204 between the integrated circuits 206. In an embodiment, patterning the mask 202 with the laser scribing process includes using a laser having a pulse width in the femtosecond range. Specifically, a laser with a wavelength in the visible spectrum or the ultra-violet (UV) or infra-red (IR) ranges (the three totaling a broadband optical spectrum) may be used to provide a femtosecond-based laser (i.e., a laser with a pulse width on the order of the femtosecond ($10^{-15}$ seconds)). In one embodiment, ablation is not, or is essentially not, wavelength dependent and is thus suitable for complex films such as films of the mask 202, the streets 207 and, possibly, a portion of the semiconductor wafer or substrate 204.

Laser parameters selection, such as pulse width, may be critical to developing a successful laser scribing and dicing process that minimizes chipping, microcracks, and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, and semiconductors) and thicknesses are typically disposed thereon. Such materials may include, but are not limited to, organic materials such as polymers, metals, or inorganic dielectrics such as silicon dioxide and silicon nitride.

Figure 3:
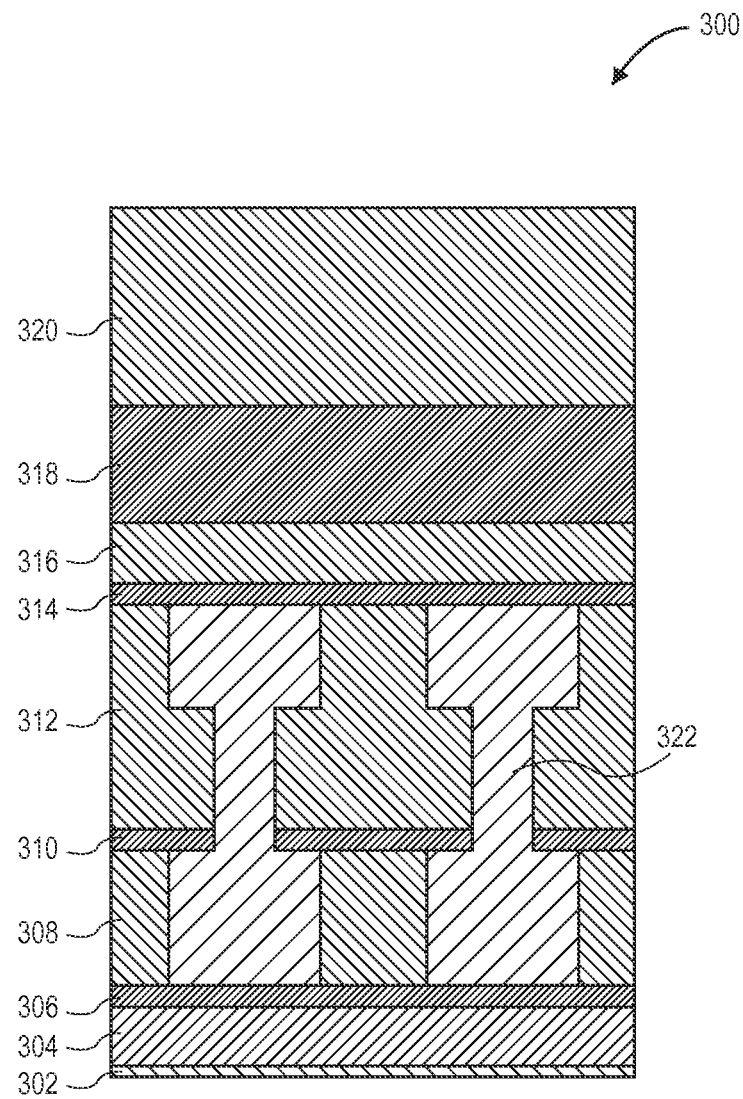
FIG. 3 illustrates a cross-sectional view of a stack of materials that may be present in a street region of a semiconductor wafer or substrate, in accordance with embodiments of the present invention.

A street between individual integrated circuits disposed on a wafer or substrate may include the similar or same layers as the integrated circuits themselves. For example, FIG. 3 illustrates a cross-sectional view of a stack of materials that may be used in a street region of a semiconductor wafer or substrate, in accordance with an embodiment of the present invention. Referring to FIG. 3, a street region 300 includes the top portion 302 of a silicon substrate (e.g., a portion of the semiconductor wafer or substrate 204) a first silicon dioxide layer 304, a first etch stop layer 306, a first low K dielectric layer 308 (e.g., having a dielectric constant of less than the dielectric constant of 4.0 for silicon dioxide), a second etch stop layer 310, a second low K dielectric layer 312, a third etch stop layer 314, an undoped silica glass (USG) layer 316, a second silicon dioxide layer 318, and a layer of photo-resist 320, with relative thicknesses depicted. Copper metallization 322 is disposed between the first and third etch stop layers 306 and 314 and through the second etch stop layer 310. In a specific embodiment, the first, second and third etch stop layers 306, 310, and 314 are composed of silicon nitride, while low K dielectric layers 308 and 312 are composed of a carbon-doped silicon oxide material.

Under conventional laser irradiation (such as nanosecond-based or picosecond-based laser irradiation), the materials of street 300 may behave quite differently in terms of optical absorption and ablation mechanisms. For example, dielectric layers (e.g., silicon dioxide layers) are essentially transparent to commercially available laser wavelengths under normal conditions. By contrast, metals, organics (e.g., low K materials), and silicon can couple photons very easily, particularly in response to nanosecond-based or picosecond-based laser irradiation. In an embodiment, however, a femtosecond-based laser process is used to pattern a layer of silicon dioxide, a layer of low K material, and a layer of copper by ablating the layer of silicon dioxide prior to ablating the layer of low K material and the layer of copper. In a specific embodiment, pulses of approximately less than or equal to 400 femtoseconds are used in a femtosecond-based laser irradiation process to remove a mask, a street, and a portion of a silicon substrate.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns.

The spacial beam profile at the work surface may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 µJ to 100 µJ, although preferably approximately in the range of 1 µJ to 5 µJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably one to two passes. In one embodiment, the scribing depth in the work piece is approximately in the range of 5 microns to 50 microns deep, preferably approximately in the range of 10 microns to 20 microns deep. The laser may be applied either in a train of single pulses at a given pulse repetition rate or a train of pulse bursts. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

Returning to FIGS. 1A and 1B, at operation 106, the semiconductor wafer is plasma etched to singulate the ICs. As illustrated in FIG. 2C, the plasma etch front proceeds through the gaps 210 in the patterned mask 208 to form singulated integrated circuits 206. In accordance with an embodiment of the present invention, etching the semiconductor wafer includes etching the trenches formed with the laser scribing process to ultimately etch entirely through the semiconductor wafer. This is illustrated both in FIG. 2C for the substrate 204 and in FIG. 4E for the substrate 400 (with formation of the through trench 416). In the exemplary embodiments illustrated by 4E, the plasma etch process is stopped on the adhesive film 406 with individualized portions 414A and 414B of the semiconductor wafer 400 separated by gaps 416.

In one embodiment, the plasma etching operation employs a through-silicon via type etch process. Where electrostatic chucking is employed by the etch process, the carrier substrate is heated to a chucking temperature. Elevating the temperature of the carrier substrate to the chucking temperature accelerates the rate at which the electrostatic clamping force is developed to be greater than a rate possible at the temperature of an ESC during a plasma process. For one embodiment where the semiconductor wafer is masked with photo resist, the chucking temperature is below about 110° C. to avoid reticulation of the photo resist mask. For embodiments employing a borosilicate glass carrier substrate, the chucking temperature is over 50° C., favorably between 60° C. and 90° C., and ideally between 70° C. and 90° C. The carrier substrate may be heated in any manner, such as, but not limited to, plasma heating, radiative (lamp) heating, or conductive heating from the ESC. Upon reaching the chucking temperature, the carrier substrate is then clamped to the ESC. The carrier substrate is then cooled from the chucking temperature to a process temperature, and the semiconductor wafer etched through the gaps in the patterned mask while at the process temperature. Following the plasma etch, the carrier substrate may then be heated back up from the process temperature up to a dechucking temperature, and unclamped from the ESC upon reaching the dechucking temperature.

In a specific embodiment, during the etch process the etch rate of the material of semiconductor wafer 204 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines capacitive and inductive RF coupling, which gives more independent control of the ion density and ion energy than is possible with capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. Multi-RF source configurations also results in an exceptionally wide process window. However, any plasma etch chamber capable of etching silicon may be used. In an exemplary embodiment, a deep silicon etch is used to etch a single crystalline silicon substrate or wafer 204 at an etch rate greater than approximately 40% of conventional silicon etch rates (e.g., 40 µm, or more) while maintaining essentially precise profile control and virtually scallop-free sidewalls. In a specific embodiment, a through-silicon via type etch process is used. The etch process is based on a plasma generated from a reactive gas, which generally is a fluorine-based gas such as $SF_6$, $C_4F_8$, $CHF_3$, $XeF_2$, or any other reactant gas capable of etching silicon at a relatively fast etch rate.

Following the plasma etch operation 106 of FIGS. 1A and 1B, the singulated integrated circuits remain coupled to the UV-curable adhesive film. Referring to FIG. 1A, at operation 108, and described in greater detail below in association with FIGS. 4F-4H, the UV-curable adhesive film is cured with UV (light) energy irradiation to weaken the adhesive properties of at least one side of the UV-curable adhesive film. In the exemplary embodiment illustrated by FIG. 4F, the patterned mask is removed after the laser scribe and plasma etch portions of the singulation process and before removal of the adhesive film 406. This is also depicted by FIG. 2C. However, in alternate embodiments, the patterned mask may be removed during, or following UV irradiation of the UV-curable adhesive film.

Figure 4G:
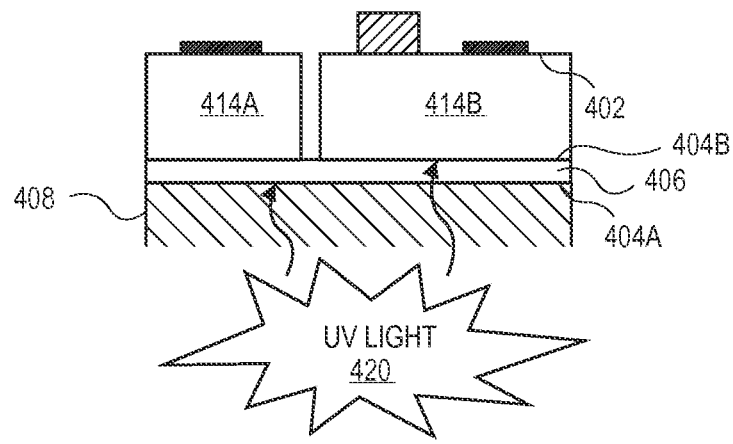

In embodiments, partially curing the UV-curable adhesive film entails curing a first side of a double-sided UV-curable adhesive film more completely than the second side. As illustrated by FIG. 4G, the UV-curable adhesive film is irradiated with UV light through the carrier substrate 408, which is transmissive of, or even transparent to, at least some of the UV light wavelengths emitted by a UV cure apparatus employing the UV light 420. The UV light is also transmitted through the substrate film of the UV-curable adhesive film and for advantageous embodiments where the adhesive layer 404B in contact with the semiconductor wafer cures more rapidly than does the adhesive layer 404A in contact with the carrier substrate, the partial curing results in a release of the individualized ICs 414A and 414B from the adhesive tape. For example, as in operation 107 in method 140 of FIG. 1B, there is a complete cure of the adhesive side in contact with the wafer, but the adhesive side in contact with the carrier is incompletely cured. In one specific embodiment where curing a UV-release adhesive entails reducing an adhesiveness of one side of UV-curable adhesive film by at least 90%, the other side, which is not as completely cured, has an adhesiveness reduced by less than 90%.

Figure 4H:
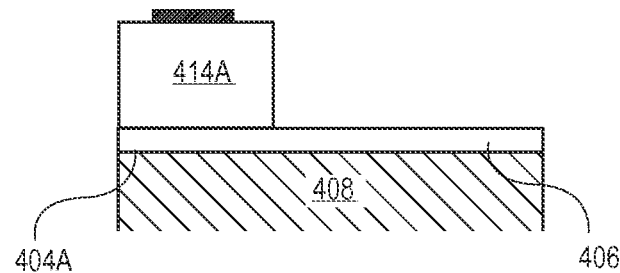

As further illustrated in FIG. 4H, the adhesive film is thereby preferentially retained on the carrier substrate 408 when individualized ICs 414A and 414B are detached from the adhesive film and/or carrier substrate 408. Notably, the operation 108 of FIG. 1A may be performed at a package assembly house after a diced wafer was transported on a carrier from an IC fabrication facility, for example. The package assembly house may thereby utilize the carrier substrate 408 much as they would a tape frame in a conventional pick and place packaging process. In one such embodiment, for example as illustrated by operation 111 in the method 140 of FIG. 1B, detachment of dies is on an individual die-basis with a conventional pick-and-place machine.

Alternatively, a protective layer, such as a conventional protective dicing tape may be applied to the side opposite the double-sided UV adhesive film 406, for example as would be done to a side of the semiconductor prior to dicing in conventional dicing tape/tape frame application. Once a front-side dicing tape was applied, the UV-curable adhesive film 406 may be partially cured to release the wafer side of the UV-curable adhesive film 406 as the front-side tape is expanded onto a tape frame. In such embodiments, the individualized die 414A and 414B are detached from the UV-curable adhesive film 406 en masse.

Figure 4I:
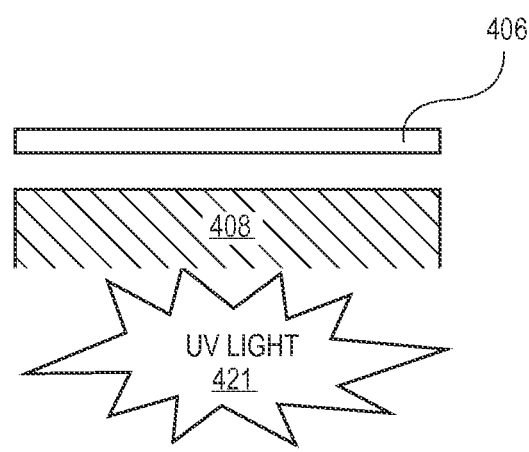

In embodiments, following removal of the individualized dies from the adhesive film, a complete cure of the film is performed, for example by re-irradiating the carrier substrate 408 with UV light. As illustrated by FIG. 4I, additional UV-cure is performed and the fully cured UV-curable adhesive film 406 is removed from the carrier substrate 408. The carrier substrate 408 may then be reused for another dicing operation.

Thus, in accordance with an embodiment of the present invention, a UV-curable adhesive film is applied to a device wafer for singulation. The UV-curable adhesive film is applied onto a carrier tape or carrier wafer. After the laser scribing and subsequent silicon etch processes, the dies are singulated while portions of the UV-curable adhesive film along the wafer streets are exposed. The singulated device wafer is then, in one embodiment, released from the UV-curable adhesive film upon irradiation of the UV-curable adhesive film with UV light.

Referring again to FIGS. 2A-2C, the plurality of integrated circuits 206 may be separated by streets 207 having a width of approximately 10 microns or smaller. The use of a femtosecond-based laser scribing approach, at least in part due to the tight profile control of the laser, may enable such compaction in a layout of integrated circuits. It is to be understood, however, that it may not always be desirable to reduce the street width to less than 10 microns even if otherwise enabled by a femtosecond-based laser scribing process. For example, some applications may require a street width of at least 40 microns in order to fabricate dummy or test devices in the streets separating the integrated circuits. In an embodiment, the plurality of integrated circuits 206 may be arranged on semiconductor wafer or substrate 204 in a non-restricted or freeform layout.

A single process tool may be configured to perform many or all of the operations in a hybrid laser ablation and plasma etch singulation process including the use of a UV-curable adhesive film. For example, FIG. 5 illustrates a block diagram of a tool layout for laser and plasma dicing of wafers or substrates, in accordance with an embodiment of the present invention.

Figure 5:
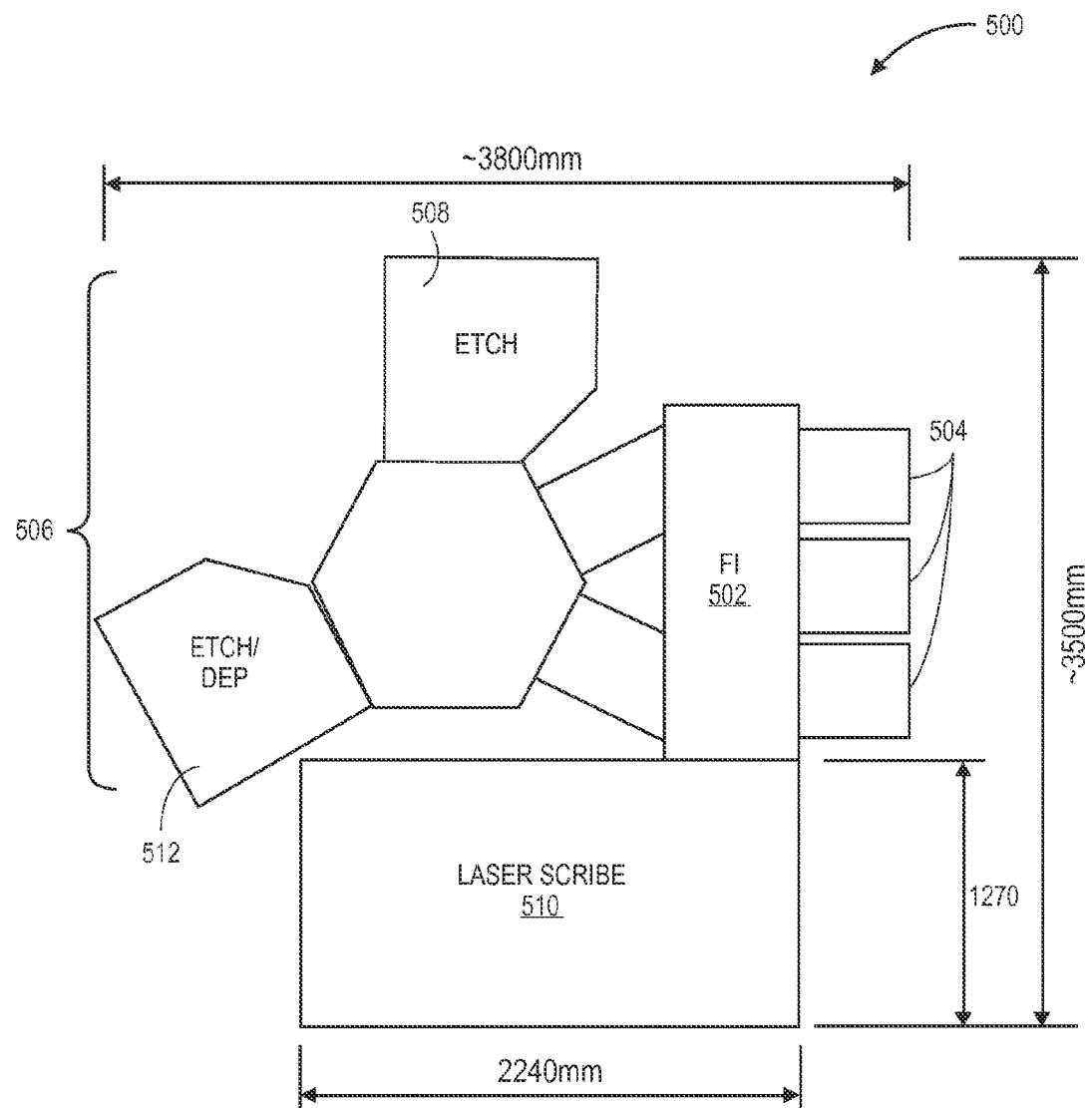
FIG. 5 illustrates a block diagram of a tool layout for laser and plasma dicing of wafers or substrates, in accordance with embodiments of the present invention.

Referring to FIG. 5, a process tool 500 includes a factory interface 502 (FI) having a plurality of load locks 504 coupled therewith. A cluster tool 506 is coupled with the factory interface 502. The cluster tool 506 includes a plasma etch chamber 508. A laser scribe apparatus 510 is also coupled to the factory interface 502. The overall footprint of the process tool 500 may be, in one embodiment, approximately 3500 millimeters (3.5 meters) by approximately 3800 millimeters (3.8 meters), as depicted in FIG. 5.

In an embodiment, the laser scribe apparatus 510 houses a laser. In one such embodiment, the laser is a femtosecond-based laser. The laser is suitable for performing a laser ablation portion of a hybrid laser and etch singulation process including the use of a mask, such as the laser ablation processes described above. In one embodiment, a moveable stage is also included in the laser scribe apparatus 500, the moveable stage configured for moving a wafer or substrate (or a carrier thereof) relative to the laser. In a specific embodiment, the laser is also moveable. The overall footprint of the laser scribe apparatus 510 may be, in one embodiment, approximately 2,240 millimeters by approximately 1,270 millimeters, as depicted in FIG. 5.

In an embodiment, the plasma etch chamber 508 is configured for etching a wafer or substrate through the gaps in a patterned mask to singulate a plurality of integrated circuits. In one such embodiment, the plasma etch chamber 508 is configured to perform a deep silicon etch process. In a specific embodiment, the plasma etch chamber 508 is an Applied Centura® Silvia™ Etch system, available from Applied Materials of Sunnyvale, Calif., USA. The plasma etch chamber 508 may be specifically designed for a deep silicon etch used to create singulate integrated circuits housed on or in single crystalline silicon substrates or wafers. In an embodiment, a high-density plasma source is included in the plasma etch chamber 508 to facilitate high silicon etch rates. In an embodiment, more than one plasma etch chamber is included in the cluster tool 506 portion of the process tool 500 to enable high manufacturing throughput of the singulation or dicing process.

In an embodiment, the plasma etch chamber 508 includes an electrostatic chuck (ESC) disposed within the chamber to clamp a carrier substrate during a plasma process. A first heat exchanger may further be coupled to the ESC and the plasma etch chamber 508 may further include a heat source to heat the carrier substrate to a first temperature that is greater than a setpoint of the first heat exchanger, for example until completion of a workpiece chucking sequence. The first heat exchanger is then to cool the ESC to a second temperature following completion of the carrier substrate chucking sequence. In embodiments, the heat source is at least one of: a second heat exchanger, a lamp, an RF plasma bias power generator. In further embodiments, one or more switched valves are employed to decouple the first heat exchanger from the ESC and to couple a second heat exchanger to the ESC to cool the ESC from the first temperature to the second temperature, for example in response to completion of a carrier substrate chucking sequence. In embodiments, a setpoint of the first heat exchanger is at least 35° C. higher than a setpoint of the second heat exchanger. In further embodiments, a controller is employed to reduce a backside helium pressure while the RF plasma bias power is heating the workpiece.

The factory interface 502 may be a suitable atmospheric port to interface between an outside manufacturing facility with laser scribe apparatus 510 and cluster tool 506. The factory interface 502 may include robots with arms or blades for transferring wafers (or carriers thereof) from storage units (such as front opening unified pods) into either the cluster tool 506 or the laser scribe apparatus 510, or both.

The cluster tool 506 may include an additional etch chamber 512 and/or other chambers suitable for performing functions in a method of singulation. For example, in one embodiment, a deposition chamber 512 is included. The deposition chamber 512 may be configured for mask deposition on or above a device layer of a wafer or substrate prior to laser scribing of the wafer or substrate. In one such embodiment, the deposition chamber 512 is suitable for depositing a photo-resist layer.

Thus, described herein is a method and system of dicing using UV-curable adhesive films. Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A method of dicing a semiconductor wafer comprising a plurality of integrated circuits, the method comprising:
coupling the semiconductor wafer to a carrier substrate with a double-sided ultraviolet (UV)-curable adhesive film;
forming a mask above the semiconductor wafer, the mask covering and protecting the integrated circuits;
patterning the mask with a laser scribe process to provide a patterned mask with gaps, exposing regions of the semiconductor wafer between the integrated circuits; and
etching the semiconductor wafer through the gaps in the patterned mask to form singulated integrated circuits;
curing a first side of the UV-curable adhesive film by exposure to UV light, wherein the UV-curable adhesive film comprises a carrier film disposed between first and second adhesive layers, the first adhesive layer disposed on the first side having a shorter curing time than the second adhesive layer; and
detaching the singulated integrated circuits from the cured first side of the UV-curable adhesive film.

2. The method of claim 1, wherein coupling the wafer to the carrier substrate further comprises contacting the first adhesive layer to the wafer and contacting the second adhesive layer to the carrier substrate; and wherein curing the UV-curable adhesive film with UV light comprises curing the first adhesive layer more completely than the second adhesive layer.

3. The method of claim 2, wherein detaching the singulated integrated circuits is performed before the second adhesive layer is cured, and wherein the method further comprises:
   subsequently exposing the UV-curable adhesive film to UV light to complete curing of the second adhesive layer; and
   detaching the cured UV-curable adhesive film from the carrier substrate.

4. The method of claim 2, wherein the carrier film comprises polyvinyl chloride and the two adhesive layers are acrylic-based adhesive layers.

5. The method of claim 2, wherein contacting the first adhesive layer to the wafer and contacting the second adhesive layer to the carrier substrate further comprises:
   contacting the first adhesive layer to the masked semiconductor wafer;
   aligning the masked semiconductor wafer to the carrier substrate; and
   contacting the second adhesive layer to the carrier substrate.

6. The method of claim 1, wherein the UV-curable adhesive film and the carrier substrate are transparent to UV light; and
   wherein curing the UV-curable adhesive film with UV light comprises irradiating through the carrier substrate and through the UV-curable adhesive film.

7. The method of claim 6, wherein the carrier substrate is a silica glass, has a diameter of at least 300 mm and within 25 mm of the diameter of the semiconductor wafer, and is between 300 and 700 μm thick.

8. The method of claim 7, wherein the semiconductor wafer is silicon, has a thickness approximately in the range of 100-600 μm, and is between 300 and 450 mm in diameter.

9. The method of claim 1, wherein patterning the mask with the laser scribing process comprises patterning with a femtosecond-based laser scribing process, and wherein etching the semiconductor wafer through the gaps in the patterned mask comprises using a high density plasma etching process.

10. The method of claim 9, wherein using a high density plasma etching process comprises:
    heating the carrier substrate to a chucking temperature;
    clamping the carrier substrate to an electrostatic chuck (ESC) upon reaching the chucking temperature;
    cooling the carrier substrate from the chucking temperature to a process temperature;
    plasma etching the semiconductor wafer through the gaps in the patterned mask while at the process temperature;
    heating the carrier substrate from the process temperature up to a dechucking temperature; and
    unclamping the carrier substrate from the ESC upon reaching the dechucking temperature.

11. The method of claim 1, wherein curing the UV-curable adhesive film with UV light comprises reducing an adhesiveness of the first side by at least 90% and reducing an adhesiveness of a second side of the film by less than 90%.

12. A method of dicing a semiconductor wafer comprising a plurality of integrated circuits, the method comprising:
    coupling a masked crystalline silicon substrate to a carrier substrate with a double-sided UV-curable adhesive film, a mask disposed on the silicon substrate covering and protecting the integrated circuits disposed on the silicon substrate;
    patterning the mask, at least a layer of silicon dioxide, a layer of low K material, and a layer of copper with a laser scribing process to expose regions of the silicon substrate between the integrated circuits;
    etching the silicon substrate through the exposed regions to form singulated integrated circuits;
    exposing the UV-curable adhesive film to ultra-violet (UV) light to cure a first adhesive side more completely than a second adhesive side; and
    detaching the singulated integrated circuits from the cured first adhesive side of the UV-curable adhesive film.

13. The method of claim 12, further comprising forming the mask above the silicon substrate before the substrate is coupled to the carrier substrate.

14. The method of claim 12, wherein coupling the masked silicon substrate to the carrier substrate further comprises contacting the first adhesive side to the masked silicon substrate and contacting the second adhesive side to the carrier substrate.

15. The method of claim 14, wherein contacting the first adhesive side to the masked silicon substrate and contacting the second adhesive side to the carrier substrate further comprises:
    contacting the second adhesive side to the carrier substrate;
    aligning the wafer to the carrier substrate; and
    contacting the first adhesive side to the masked silicon substrate after the second adhesive side has contacted the carrier substrate.

16. The method of claim 12, wherein the film is exposed to UV light for a time sufficient to reduce an adhesiveness of the first adhesive side by at least 90% and reducing an adhesiveness of the second adhesive side by less than 90%.

17. The method of claim 16, wherein detaching the singulated integrated circuits is performed while adhesiveness of the second adhesive side is reduced by less than 90%, and wherein the method further comprises:
    subsequently exposing the UV-curable adhesive film to UV light to complete curing of the second adhesive side; and
    detaching the cured UV-curable adhesive film from the carrier substrate.

18. The method of claim 12, wherein the carrier substrate is transparent to UV light and exposing the UV-curable adhesive film to UV light comprises irradiating through the carrier substrate and through the UV-curable adhesive film.

19. The method of claim 12, further comprising:
    subsequent to etching the silicon substrate and prior to irradiating the UV-curable adhesive film, removing the mask.

20. The method of claim 12, wherein the UV-curable adhesive film includes a carrier film comprising polyvinyl chloride disposed between two acrylic-based adhesive layers.

21. The method of claim 12, wherein patterning the mask, the layer of silicon dioxide, the layer of low K material, and the layer of copper with the laser scribing process comprises patterning with a femtosecond-based laser scribing process, and wherein etching the silicon substrate through the exposed regions comprises using a high density plasma etching process.

22. The method of claim 12, wherein patterning the mask, the layer of silicon dioxide, the layer of low K material, and the layer of copper with the laser scribing process comprises ablating the mask prior to ablating the layer of silicon dioxide, and ablating the layer of silicon dioxide prior to ablating the layer of low K material and the layer of copper.

* * * * *